(12) United States Patent
Yuasa et al.

(10) Patent No.: US 12,032,025 B2
(45) Date of Patent: Jul. 9, 2024

(54) PERMANENT MAGNET SYNCHRONOUS MOTOR DIAGNOSTIC DEVICE AND INVERTER COMPRISING THE SAME

(71) Applicant: Mitsubishi Electric Corporation, Tokyo (JP)

(72) Inventors: Kenta Yuasa, Tokyo (JP); Kazunori Sakanobe, Tokyo (JP); Mamoru Kamikura, Tokyo (JP); Toshiyuki Kuriyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 150 days.

(21) Appl. No.: 17/781,367

(22) PCT Filed: Feb. 17, 2020

(86) PCT No.: PCT/JP2020/006102
§ 371 (c)(1),
(2) Date: May 31, 2022

(87) PCT Pub. No.: WO2021/166042
PCT Pub. Date: Aug. 26, 2021

(65) Prior Publication Data
US 2023/0003798 A1  Jan. 5, 2023

(51) Int. Cl.
*G01R 31/34* (2020.01)
*G01R 19/00* (2006.01)
(Continued)

(52) U.S. Cl.
CPC ......... *G01R 31/34* (2013.01); *G01R 19/0092* (2013.01); *H02P 25/022* (2013.01); *H02P 27/06* (2013.01)

(58) Field of Classification Search
CPC .. G01R 31/34; G01R 19/0092; G01R 31/343; H02P 25/022; H02P 27/06; H02P 29/024
(Continued)

(56) References Cited

U.S. PATENT DOCUMENTS 5,270,640 A * 12/1993 Kohler ................. G01R 31/343
324/765.01
8,135,551 B2 * 3/2012 Tiwari ................. G01R 31/343
324/76.38
(Continued)

FOREIGN PATENT DOCUMENTS

JP    01-172621 A    7/1989
JP    2002-189064 A  7/2002
(Continued)

OTHER PUBLICATIONS

Extended European Search Report dated Mar. 9, 2023 issued in corresponding European Patent Application No. 20919728.4.
(Continued)

*Primary Examiner* — David Luo
(74) *Attorney, Agent, or Firm* — Posz Law Group, PLC (57) ABSTRACT a permanent magnet synchronous motor diagnostic device includes: a negative-sequence current calculator that calculates a negative-sequence current, based on magnitudes of a plurality of phase currents flowing through a permanent magnet synchronous motor that rotates a load; and a deterioration diagnoser that diagnoses deterioration of a plain bearing supporting the permanent magnet synchronous motor, based on the negative-sequence current.

8 Claims, 8 Drawing Sheets

(51) Int. Cl.
*H02P 25/022* (2016.01)
*H02P 27/06* (2006.01)

(58) Field of Classification Search
USPC .................................................. 318/490, 700
See application file for complete search history.

(56) References Cited

U.S. PATENT DOCUMENTS

| | | | | |
|---|---|---|---|---|
| 8,803,461 | B2 * | 8/2014 | Tiwari | H02P 23/14 318/459 |
| 10,273,940 | B2 * | 4/2019 | Pan | F03D 17/00 |

FOREIGN PATENT DOCUMENTS

| | | |
|---|---|---|
| JP | 2003-075516 A | 3/2003 |
| JP | 2006-349404 A | 12/2006 |
| JP | 2008-175821 A | 7/2008 |
| JP | 4299271 B2 | 7/2009 |
| JP | 2013-160749 A | 8/2013 |
| WO | 2014/0156386 A1 | 2/2014 |

OTHER PUBLICATIONS

Le Roux, Wiehan et al. "Detecting Rotor Faults in Permanent Magnet Synchronous Machines." Diagnostics for Electric Machines, Power Electronics and Drives, 2003. SDEMPED 2003. 4th IEEE International Symposium on Aug. 24-26, 2003, Piscataway, NJ, USA, IEEE, pp. 198-203.

Wu, Long et al. "Improved Online Condition Monitoring Using Static Eccentricity-Induced Negative Sequence Current Information in Induction Machines." Industrial Electronics Society, 2005. 31st Annual Conference of IEEE, IEEE, Piscataway, NJ, USA, (Nov. 6, 2005), pp. 1737-1742.

Chen, Jiang et al. "Static Eccentricity Fault Detection of the BLDC Motor inside the Air Handler Unit (AHU)." 2015 IEEE International Electric Machines & Drives Conference (IEMDC), IEEE, (May 10, 2015), pp. 1473-1476.

International Search Report of the International Searching Authority mailed May 19, 2020 for the corresponding International application No. PCT/JP2020/006102 (and English translation).

Office Action mailed Sep. 26, 2023 in corresponding Japanese Patent Application No. 2022-501414 (and English translation).

Office Action mailed Jul. 25, 2023 issued in corresponding Japanese Patent Application No. 2022-501414 (and English translation).

* cited by examiner

PERMANENT MAGNET SYNCHRONOUS MOTOR DIAGNOSTIC DEVICE AND INVERTER COMPRISING THE SAME

CROSS REFERENCE TO RELATED APPLICATION

This application is a U.S. national stage application of PCT/JP2020/006102 filed on Feb. 17, 2020, the contents of which are incorporated herein by reference.

TECHNICAL FIELD

The present disclosure relates to a permanent magnet synchronous motor diagnostic device and an inverter comprising the same.

BACKGROUND ART

An apparatus is known for diagnosing deterioration of a plain bearing supporting a permanent magnet synchronous motor. For example, PTL 1 discloses a bearing abnormality detection apparatus which compares a stop time from a particular rotational speed of a motor to a rotational stop with a predetermined reference stop time, thereby determining the presence or absence of bearing abnormality.

CITATION LIST

Patent Literature

PTL 1: Japanese Patent Laying-Open No. 2008-175821

SUMMARY OF INVENTION

Technical Problem

However, the bearing abnormality detection apparatus, disclosed in PTL 1, does not necessarily have high accuracy in detecting the bearing abnormality because the stop time from the particular rotational speed of the motor to the rotational stop changes even when a load torque driven by the motor is changed due to environmental factors. The bearing abnormality detection apparatus disclosed in PTL 1 is unable to differentiate between variations in load torque and the bearing abnormality.

Therefore, an object of the present disclosure is to provide a permanent magnet synchronous motor diagnostic device and an inverter including the same, which detect with accuracy the deterioration of a plain bearing supporting a permanent magnet synchronous motor.

Solution to Problem

A permanent magnet synchronous motor diagnostic device according to the present disclosure includes: a negative-sequence current calculator that calculates a negative-sequence current, based on magnitudes of a plurality of phase currents flowing through a permanent magnet synchronous motor that rotates a load; and a deterioration diagnoser that diagnoses, based on the negative-sequence current, deterioration of a plain bearing supporting the permanent magnet synchronous motor.

Preferably, the permanent magnet synchronous motor diagnostic device according to the present disclosure detects enlargement of a hollow between the plain bearing and a main shaft, based on the negative-sequence current.

Advantageous Effects of Invention

According to the present disclosure, the permanent magnet synchronous motor diagnostic device: calculates the negative-sequence current based on magnitudes of the plurality of phases currents; and diagnoses deterioration of the plain bearing supporting the permanent magnet synchronous motor, based on the negative-sequence current.

Based on the negative-sequence current, the permanent magnet synchronous motor diagnostic device detects enlargement of a hollow between the plain bearing and the main shaft. This allows accurate diagnosis of deterioration of the plain bearing supporting the permanent magnet synchronous motor.

DESCRIPTION OF EMBODIMENT

Hereinafter, embodiments will be described, with reference to the accompanying drawings. In the drawings, like reference signs are used to refer to like components.

Embodiment 1

A motor diagnostic device 7 according to Embodiment 1 detects the motor current of a compressor 6 to diagnose a deteriorated state of a plain bearing within a permanent magnet synchronous motor.

Figure 1:
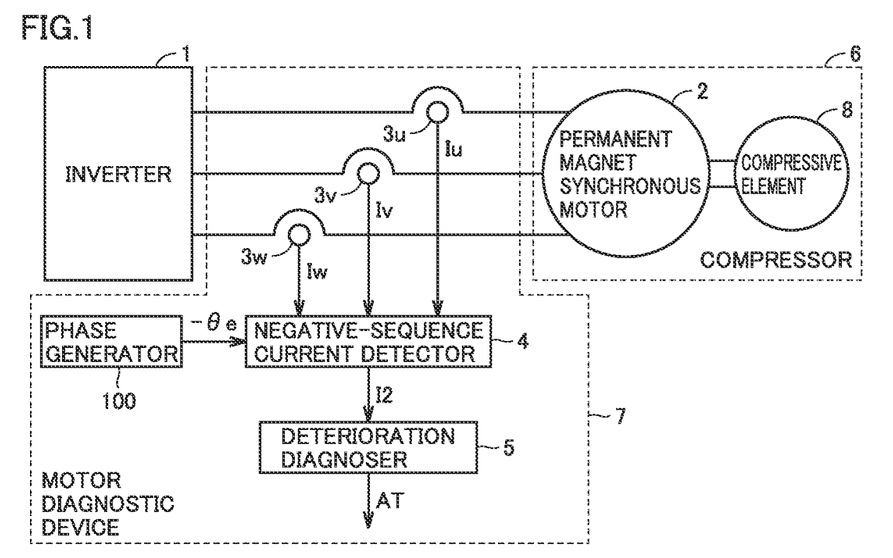
FIG. 1 is a diagram illustrating a configuration of a system according to Embodiment 1, which includes a motor diagnostic device 7, a compressor 6, and an inverter 1.

FIG. 1 is a diagram illustrating a configuration of a system according to Embodiment 1, which includes the motor diagnostic device 7, the compressor 6, and an inverter 1.

The motor diagnostic device 7 includes current detectors 3u, 3v, and 3w, a phase generator 100, a negative-sequence current detector 4, and a deterioration diagnoser 5.

The current detector 3u is disposed on a U-phase line between the inverter 1 and a permanent magnet synchronous motor 2. The current detector 3v is disposed on a V-phase line between the inverter 1 and the permanent magnet synchronous motor 2. The current detector 3w is disposed on a W-phase line between the inverter 1 and the permanent magnet synchronous motor 2. The current detectors 3u, 3v, and 3w detect currents of the U-phase line, V-phase line, and W-phase line, respectively.

The phase generator 100 outputs an opposite phase (opposite-phase information) $-\theta e$ of a voltage phase $\theta e$ of three-phase alternating voltages.

The negative-sequence current detector 4 receives currents Iu, Iv, and Iw output from the current detectors 3u, 3v, and 3w, and the opposite-phase information $-\theta e$ output from the phase generator 100. Based on the opposite-phase information $-\theta e$ and the three-phase currents Iu, Iv, and Iw, the negative-sequence current detector 4 calculates a negative-sequence current I2.

Based on the negative-sequence current I2, the deterioration diagnoser 5 diagnoses the deterioration of a plain bearing 9 supporting the permanent magnet synchronous motor 2.

Figure 2:
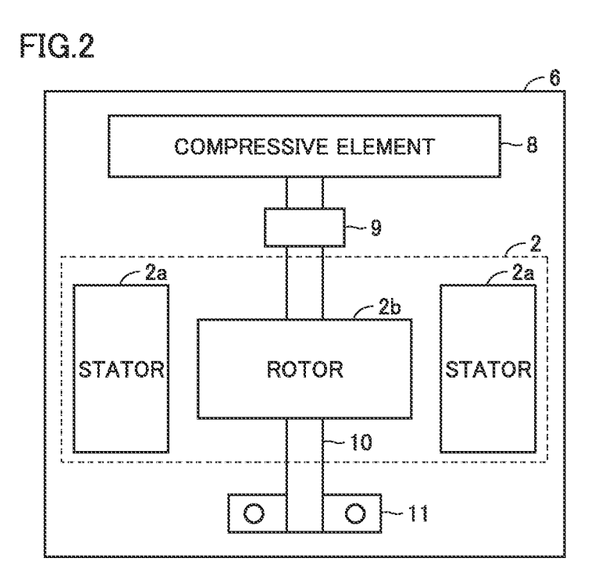
FIG. 2 is a diagram showing a configuration of the compressor 6.
Figure 3:
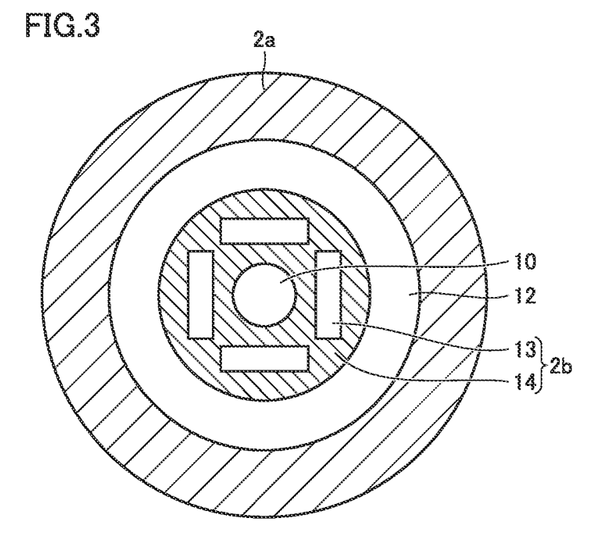
FIG. 3 is a diagram illustrating a cross section of a permanent magnet synchronous motor 2 and a main shaft 10 when a plain bearing 9 is normal.
Figure 4:
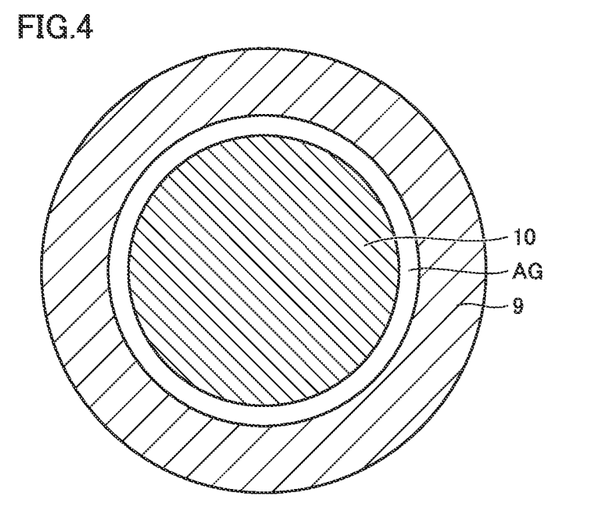
FIG. 4 is a diagram illustrating a cross section of the plain bearing 9 and the main shaft 10 when the plain bearing 9 is normal.

FIG. 2 is a diagram showing a configuration of the compressor 6. FIG. 3 is a diagram illustrating a cross section of the permanent magnet synchronous motor 2 and a main shaft 10 when the plain bearing 9 is normal. FIG. 4 is a diagram illustrating a cross section of the plain bearing 9 and the main shaft 10 when the plain bearing 9 is normal.

The compressor 6 includes a compressive element 8, the permanent magnet synchronous motor 2, the main shaft 10, the plain bearing 9, and a ball bearing 11. The permanent magnet synchronous motor 2 includes a stator 2a and a rotor 2b.

The compressive element 8 compresses a gas load.

The permanent magnet synchronous motor 2 rotates the compressive element 8, which is a load.

The main shaft 10 is coupled to the rotor 2b and the compressive element 8.

The ball bearing 11 and the plain bearing 9 support the centrifugal force and the gravity for allowing the rotational motion of the main shaft 10. The plain bearing 9 supports the permanent magnet synchronous motor 2.

In order to permit the rotational motion of the main shaft 10, a hollow AG having a predetermined width is provided in a radial direction of the main shaft 10, between the plain bearing 9 and the main shaft 10. The hollow AG is, typically, lubricated with a lubricating oil.

The stator 2a includes a winding and a stator core.

The rotor 2b includes a permanent magnet 13 and a rotator core 14.

As shown in FIG. 4, when the plain bearing 9 is normal, the rotor 2b and the stator 2a are disposed coaxial with each other, having the gap 12 between the rotor 2b and the stator 2a. The gap 12 has a substantially uniform width.

Figure 5:
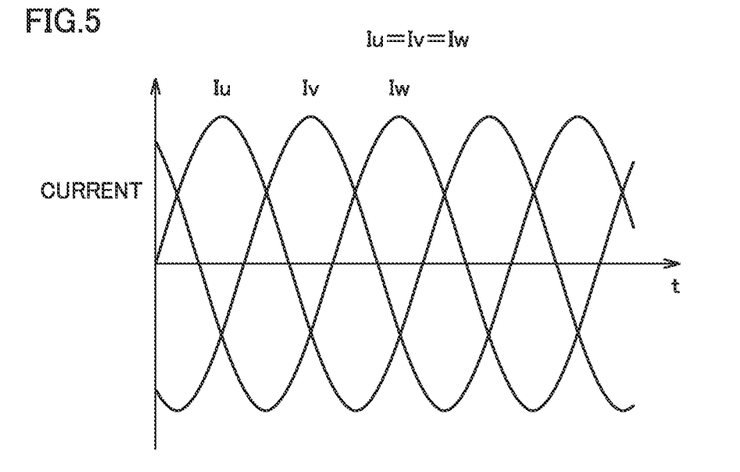
FIG. 5 is a diagram illustrating waveforms of a motor current when the plain bearing 9 is normal.

FIG. 5 is a diagram illustrating waveforms of the motor current when the plain bearing 9 is normal.

The permanent magnet synchronous motor 2 includes a winding that is designed to have a three-phase balanced impedance. Thus, as a three-phase balanced voltage is applied to the winding, balanced three-phase currents Iu, Iv, and Iw are obtained.

Figure 6:
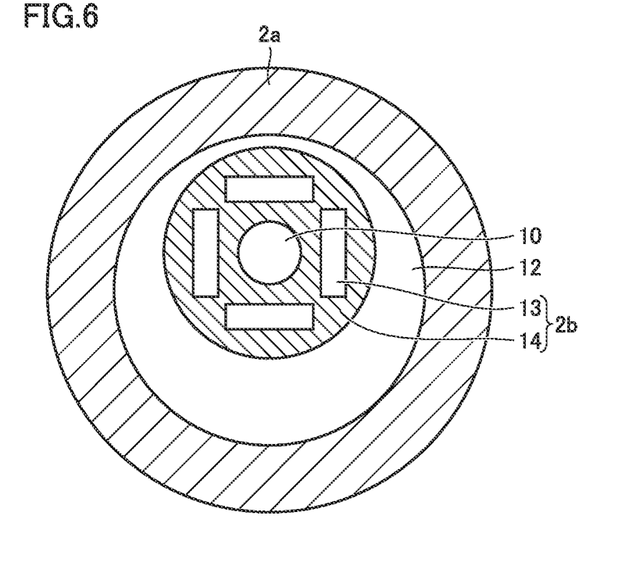
FIG. 6 is a diagram illustrating a cross section of the permanent magnet synchronous motor 2 and the main shaft 10 when the plain bearing 9 is worn.
Figure 7:
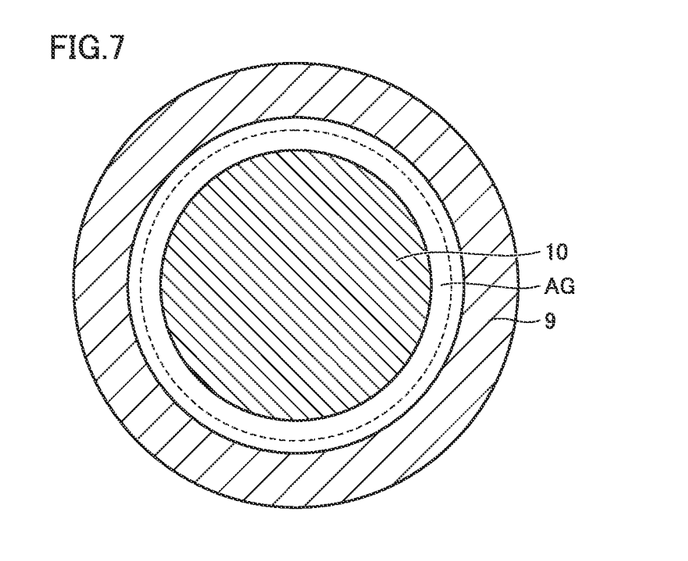
FIG. 7 is a diagram illustrating a cross section of the plain bearing 9 and the main shaft 10 when the plain bearing 9 is worn.
Figure 8:
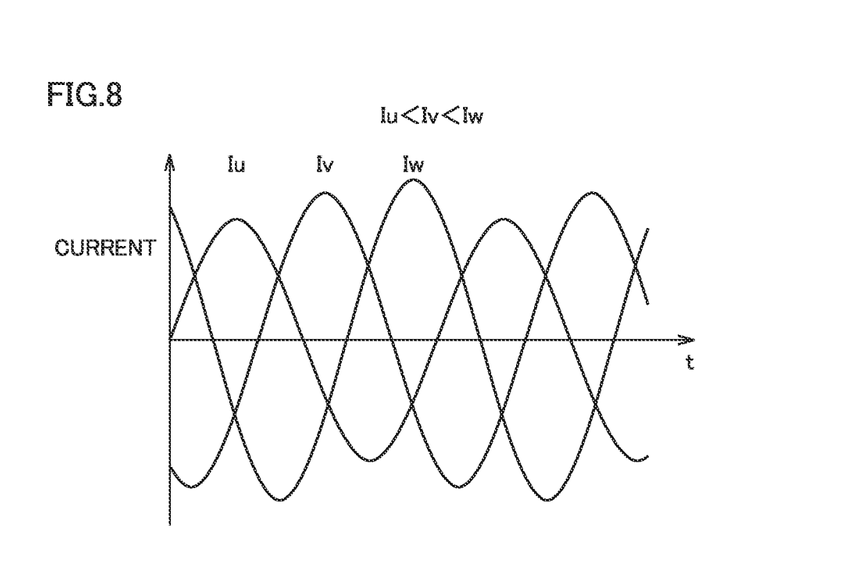
FIG. 8 is a diagram illustrating waveforms of a motor current when the plain bearing 9 is worn.

FIG. 6 is a diagram illustrating a cross section of the permanent magnet synchronous motor 2 and the main shaft 10 when the plain bearing 9 is worn. FIG. 7 is a diagram illustrating a cross section of the plain bearing 9 and the main shaft 10 when the plain bearing 9 is worn. FIG. 8 is a diagram illustrating waveforms of the motor current when the plain bearing 9 is worn.

In the compressor 6, the plain bearing 9 is worn due to various factors such as a lubrication failure or contamination. This enlarges the hollow AG greater than the initial design, as shown in FIG. 7. In the compressor 6, the hollow AG also serves as a path for a refrigerant. In adverse environment such as the hollow AG being enlarged, the lubricant oil may be entrained by the refrigerant flow and flows out of the compressor 6. As a result, the compressor 6 is brought into a lubrication failure. As the compressor 6 continues to be in a lubrication failure, the wear of the plain bearing 9 progresses.

Since the plain bearing 9 supports the radial movement of the main shaft 10, the main shaft 10 is displaced as the hollow AG opens. Accordingly, the radial width of the gap 12 in the permanent magnet synchronous motor 2 is made non-uniform, causing the permanent magnet synchronous motor 2 to be decentered, as shown in FIG. 6. The equilibrium of the impedances of the permanent magnet synchronous motor 2 comes undone due to the non-uniformity of the gap 12, resulting in the three phases being different in impedance. As a result, the three-phase currents Iu, Iv, and Iw include imbalance components, as shown in FIG. 8. The imbalance current components are, generally, called negative-sequence currents. The negative-sequence currents are theoretically derived as components that rotate in the direction opposite the phase rotation direction of three-phase alternating currents.

As the current detectors 3u, 3v, and 3w detect the currents Iu, Iv, and Iw, the phase generator 100 and the negative-sequence current detector 4 performs the following processes to extract imbalance components from the currents.

The imbalance components of the currents are known to have a frequency equal to the frequency of the three-phase alternating currents, and a phase that rotates in the direction opposite the phase rotation direction of the three-phase alternating currents.

The phase generator 100 detects a frequency f of the detected three-phase currents Iu, Iv, and Iw. Using the detected frequency f, the phase generator 100 generates a counter-rotating voltage phase $-\theta e$ that rotates in the direction opposite the phase rotation direction of the three-phase alternating currents.

Figure 9:
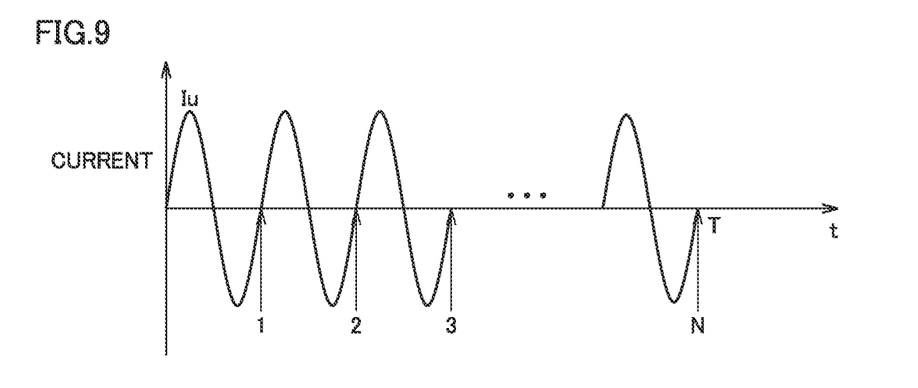
FIG. 9 is a diagram for illustrating a method of detecting a frequency f of three-phase currents Iu, Iv, and Iw by a phase generator 100.

FIG. 9 is a diagram for illustrating a method of detecting the frequency f of the three-phase currents Iu, Iv, and Iw by the phase generator 100.

The phase generator 100 measures for a predetermined time period $\Delta T$ the number of times N the polarity of the current Iu is reversed in response to rising of the current Iu. The phase generator 100 calculates the frequency f, using $\Delta T$ and N.

$$f = N/\Delta T \tag{1}$$

Figure 10:
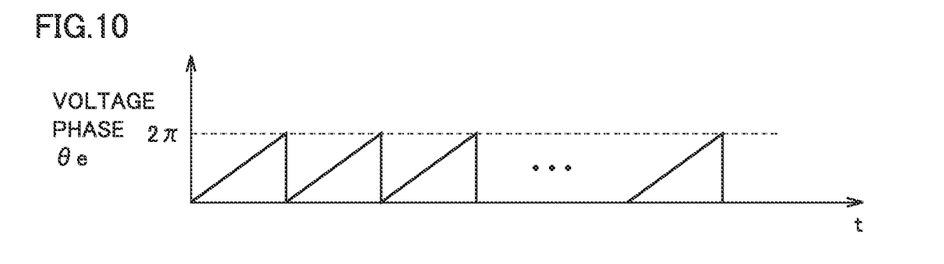
FIG. 10 is a diagram for illustrating a method of generating a voltage phase θe from the frequency f.

FIG. 10 is a diagram for illustrating a method of generating the voltage phase θe from the frequency f.

The phase generator 100 integrates the frequency f over time, thereby generating the voltage phase θe. Multiplying the voltage phase θe by −1 (reversing the sign) generates a counter-rotating voltage phase −θe, which is a voltage phase that rotates in a direction opposite the phase rotation direction of the multi-phase alternating currents.

Figure 11:
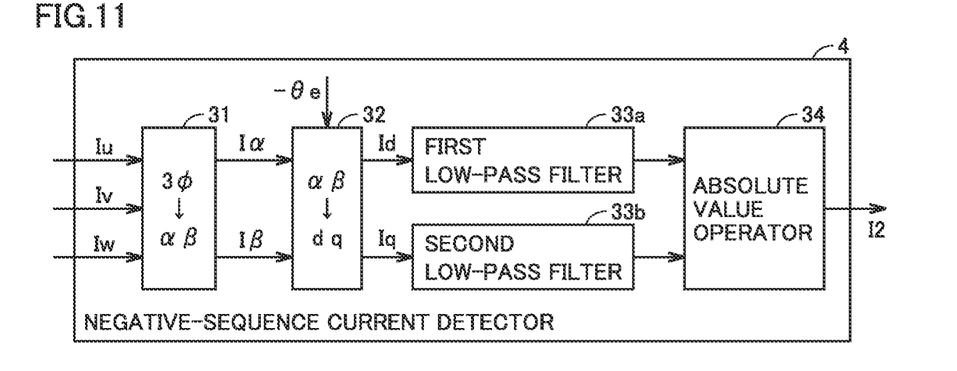
FIG. 11 is a diagram illustrating a configuration of a negative-sequence current detector 4, according to Embodiment 1.

FIG. 11 is a diagram illustrating a configuration of the negative-sequence current detector 4 according to Embodiment 1.

The negative-sequence current detector 4 includes a first phase transformer 31, a rotational coordinates transformer 32, a first low-pass filter 33a, a second low-pass filter 33b, and an absolute value operator 34.

The first phase transformer 31 transforms the three-phase currents Iu, Iv, and Iw at a predetermined timing into two-phase currents Iα and Iβ, based on Equation (2).

[MATH 1]

$$\begin{pmatrix} I\alpha \\ I\beta \end{pmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{pmatrix} Iu \\ Iv \\ Iw \end{pmatrix} \quad (2)$$

Based on Equation (3), the rotational coordinates transformer 32 transforms the two-phase currents Iα and Iβ into a first-axis direct current component Id and a second-axis direct current component Iq, which are orthogonal to each other.

[MATH 2]

$$\begin{pmatrix} Id \\ Iq \end{pmatrix} = \begin{bmatrix} \cos(-\theta_e) & -\sin(-\theta_e) \\ \sin(-\theta_e) & \cos(-\theta_e) \end{bmatrix} \begin{pmatrix} I\alpha \\ I\beta \end{pmatrix} \quad (3)$$

The first low-pass filter 33a receives the first-axis direct current component Id, and removes the alternating current component from the first-axis direct current component Id. The second low-pass filter 33b receives the second-axis direct current component Iq, and removes the alternating current component from the second-axis direct current component Iq.

The absolute value operator 34 calculates a square root of the sum of a square of the output of the first low-pass filter 33a and a square of the output of the second low-pass filter 33b, as the negative-sequence current I2.

The rotational coordinates transformer 32, the first low-pass filter 33a, and the second low-pass filter 33b form a band-pass filter specific to the current component that rotates the permanent magnet synchronous motor 2 in the opposite direction. The coordinate transformation by the rotational coordinates transformer 32 into a coordinate system, which counter-rotates the permanent magnet synchronous motor 2, transforms the reversed phase component of the alternating current into the direct-current quantity.

Based on the negative-sequence current I2, the deterioration diagnoser 5 detects enlargement of the hollow AG between the main shaft 10 and the plain bearing 9 supporting the permanent magnet synchronous motor 2. More specifically, the deterioration diagnoser 5 estimates an amount of wear ΔT of the plain bearing 9, based on a mathematical formula between the previously determined negative-sequence current I2 and the amount of wear ΔT of the plain bearing. The amount of wear ΔT represents enlargement of the hollow AG.

For example, the formula may be a linear equation, as follows:

$$\Delta T = a1 \times I2 + b1 \quad (4)$$

where, a1 and b1 are coefficients.

Alternatively, the deterioration diagnoser 5 may estimate the amount of eccentricity EC of the permanent magnet synchronous motor 2, based on a mathematical formula between the previously determined negative-sequence current I2 and the amount of eccentricity EC of the permanent magnet synchronous motor. The amount of eccentricity EC of the permanent magnet synchronous motor 2 represents the enlargement of the hollow AG. The amount of eccentricity EC of the permanent magnet synchronous motor 2 allows estimation of the amount of wear ΔT of the plain bearing 9. For example, the formula may be a linear equation as follows:

$$EC = a2 \times I2 + b2 \quad (5)$$

where, a2 and b2 are coefficients.

When the estimated amount of wear ΔT of the plain bearing 9 reaches a value that cannot be ignored for the size of the gap 12 (generally in a range from 0.1 to 1 mm), the plain bearing 9 can be diagnosed as being abnormal.

In the present embodiment, since the permanent magnet synchronous motor 2 is a three-phase motor, the number of slots of the stator 2a is an integer multiple of 3. If the stator 2a has odd numbers of slots, the phase having a reduced gap with the rotor 2b and the phase having an enlarged gap with the rotor 2b, caused by the eccentricity, are always different phases. Therefore, the changes in the negative-sequence current I2 increases, as compared to Embodiment 1, allowing more accurate diagnosis.

Figure 12:
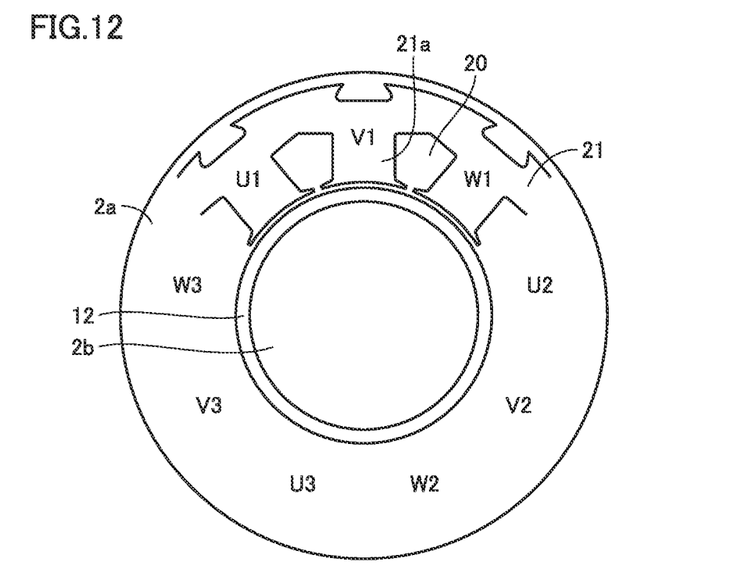
FIG. 12 is a schematic cross-sectional diagram of a 9-slot motor.

FIG. 12 is a schematic cross-sectional diagram of the 9-slot motor.

FIG. 12 shows only three slots of the 9-slot motor.

A slot 20, a stator core 21, and a teeth portion 21a of the stator core are shown. The 9-slot motor includes nine teeth portions 21a, and any of a U winding, a V winding, and a W winding is wound around each teeth portion 21a.

If the rotor 2b is decentralized in the direction towards the V phase (a V1 teeth) shown on the top of the figure, the gap between the V1 teeth and the rotor 2b is reduced, and the gaps between a U3 teeth and the rotor 2b and between a W2 teeth and the rotor 2b are enlarged. This eccentric state creates an imbalance in each phase impedance.

As described above, the motor diagnostic device according to the present embodiment extracts an imbalance component from the motor current to estimate the amount of eccentricity of the permanent magnet synchronous motor 2 or the amount of wear of the plain bearing 9. This allows the wear of the plain bearing to be detected, without disassembling the plain bearing 9 and newly providing a vibration sensor. Using clamp-type sensors as the current detectors 3u, 3v, and 3w obviates the need for disconnecting the wiring of the device to be measured, thereby more simplifying the inspection. The diagnosis of the wear of the plain bearing is highly needed for compressors, etc. the oiling and maintenance for which is difficult. Thus, the diagnosis of the wear of the plain bearing can be highly exploited and applicable.

Embodiment 2

Figure 13:
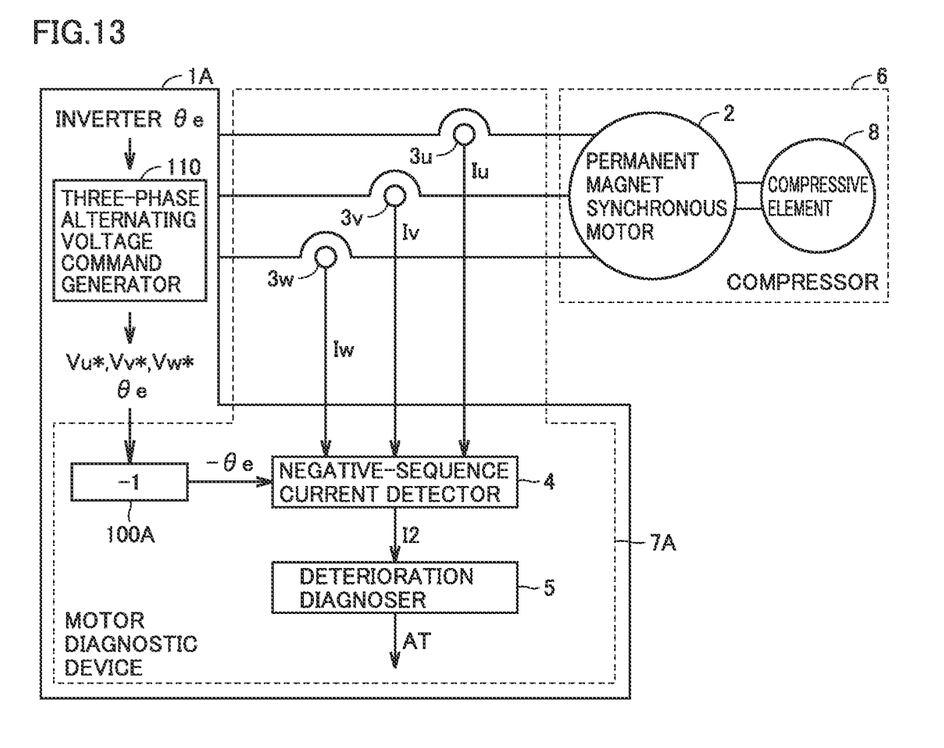
FIG. 13 is a diagram illustrating a configuration of a system according to Embodiment 2, which includes an inverter 1A and a compressor 6.

FIG. 13 is a diagram illustrating a configuration of a system according to Embodiment 2, which includes an inverter 1A and a compressor 6.

The inverter 1A has a motor diagnostic device 7A and current detectors 3u, 3v, and 3w incorporated therein.

A phase generator 100A within the motor diagnostic device 7A reverses and outputs a voltage phase θe, which is an internal signal of the inverter 1A. The voltage phase θe is used by the inverter 1A to generate three-phase alternating voltages Vu, Vv, and Vw.

In other words, a three-phase alternating voltage command generator 110 generates command values Vu*, Vv*, and Vw* for the three-phase alternating voltages, according to the following equations:

$$Vu^* = V \sin \theta e \tag{6u}$$

$$Vv^* = V \sin(\theta e - \pi/3) \tag{6v}$$

$$Vw^* = V \sin(\theta e + 2\pi/3) \tag{6w}$$

where, V is an amplitude of an output voltage command

The inverter 1A thus configured requires no detection of a frequency f of the three-phase currents as described in Embodiment 1. As a result, the processing by the phase generator 100A is simplified and excellent conformability to the diagnosis is also achieved upon changes in frequency.

Furthermore, since the inverter 1 has the current detectors 3u, 3v, and 3w, there is no need to additionally add the current detectors 3u, 3v, and 3w. Thus, the motor can be diagnosed inexpensively.

Since the inverter 1A can recognize the wear of the plain bearing 9 of the compressor 6, independent of the compressor 6, the inverter 1A can monitor the compressor 6 at all times. This can extend the life of the plain bearing 9 in real time by, for example, reducing the frequency f of the three-phase currents.

Embodiment 3

Figure 14:
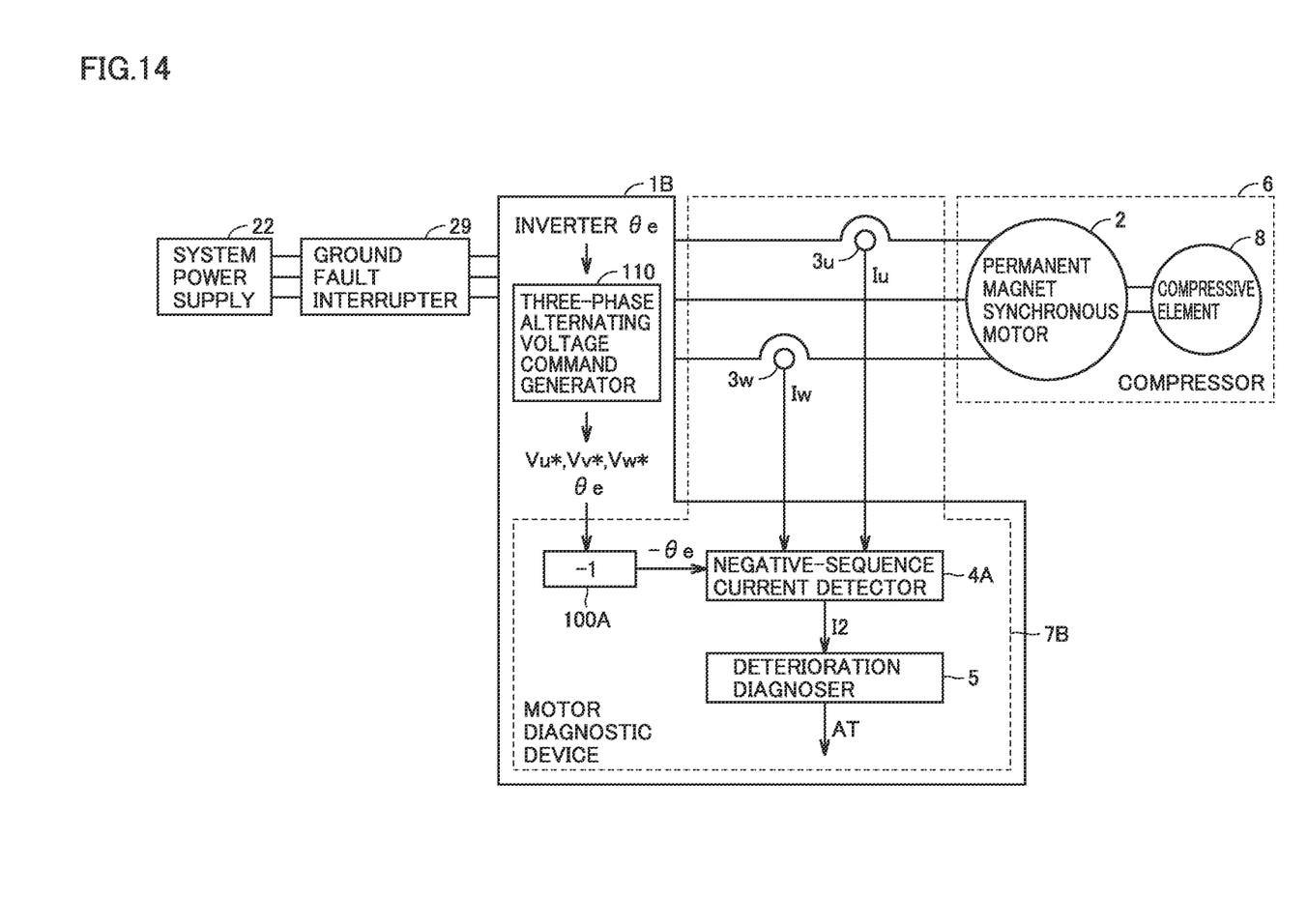
FIG. 14 is a diagram illustrating a configuration of a system according to Embodiment 3, which includes an inverter 1B, a compressor 6, and a ground fault interrupter 29.

FIG. 14 is a diagram illustrating a configuration of a system according to Embodiment 3, which includes an inverter 1B, a compressor 6, and a ground fault interrupter 29.

The system according to Embodiment 3 differs from the system according to Embodiment 2 in that: the inverter 1B according to Embodiment 3 does not include the V-phase current detector 3v, and that the ground fault interrupter 29 is disposed between the inverter 1B and a system power supply 22.

As a leak current, that is, a zero-phase current of a predetermined value TH or greater passes between the system power supply 22 and the inverter 1B, the ground fault interrupter 29 disconnects the system power supply 22 and the inverter 1B from each other.

This ensures that the zero-phase current is less than the predetermined value TH under circumstances where the system power supply 22 and the inverter are electrically connected. If a negative-sequence current I2 to be detected is sufficiently greater than the predetermined value TH at which the ground fault interrupter 29 disconnects the system power supply 22 and the inverter 1B from each other, a negative-sequence current detector, disregarding the zero-phase current, can be configured.

Current detectors 3u and 3w detect and output two-phase currents Iu and Iw to a negative-sequence current detector 4A.

Figure 15:
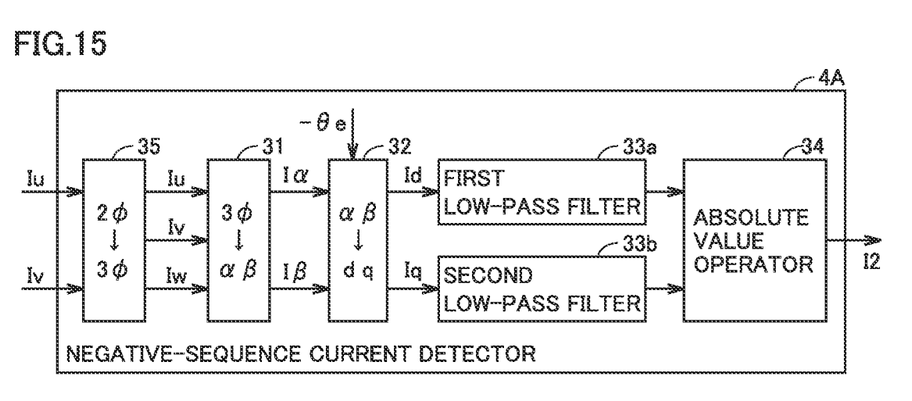
FIG. 15 is a diagram illustrating a configuration of a negative-sequence current detector 4A according to Embodiment 3.

FIG. 15 is a diagram illustrating a configuration of the negative-sequence current detector 4A according to Embodiment 3.

The negative-sequence current detector 4A according to Embodiment 3 differs from the negative-sequence current detector 4 according to Embodiment 1 of FIG. 2 in that the negative-sequence current detector 4A further includes a phase transformer 35.

Since the leak current is negligibly small, the phase transformer 35 calculates Iv not yet detected, based on the following equation. In other words, the phase transformer 35 calculates the sum of Iu and Iv, and reverses the sign of the sum, thereby calculating Iv. The phase transformer 35 outputs the three-phase currents Iu, Iv, and Iw to a phase transformer 31.

$$Iv = -(Iu + Iw) \tag{7}$$

As described above, in the present embodiment, the number of current detectors are reduced from three to two, assuming a system that can disregard the leak current. Thus, the motor can be diagnosed inexpensively.

While the present embodiment ensures by using the ground fault interrupter that the upper limit of a zero-phase current is negligible, it goes without saying that the number of current detectors can be reduced, without using the ground fault interrupter, if the leak current is previously known as being negligibly small.

While, in the embodiments above, the motor diagnostic device detects the wear of a bearing, it goes without saying that the motor diagnostic device can be used for a motor that includes a magnetic bearing which may be constantly decentralized.

The presently disclosed embodiments should be considered in all aspects as illustrative and not restrictive. The scope of the present disclosure is indicated by the appended claims, rather than by the description above, and all changes that come within the scope of the claims and the meaning and range of equivalency of the claims are intended to be embraced within their scope.

REFERENCE SIGNS LIST 1, 1A, 1B inverter; 2 permanent magnet synchronous motor; 2a stator; 2b rotor; 3u, 3v, 3w current detector; 4, 4A negative-sequence current detector; 5 deterioration diagnoser; 6 compressor; 7, 7A motor diagnostic device; 8 compressive element; 9 plain bearing; 10 main shaft; 11 ball bearing; 12 gap; 13 permanent magnet; 14 rotator core; 20 slot; 21 stator core; 21a teeth portion; 22 system power supply; 29 ground fault interrupter; 31, 35 phase transformer; 32 rotational coordinates transformer; 33a first low-pass filter; 33b second low-pass filter; 34 absolute value operator; 100, 100A phase generator; and 110 alternating voltage command generator.

The invention claimed is:

1. A permanent magnet synchronous motor diagnostic device, comprising:
   a negative-sequence current calculator that calculates a negative-sequence current, based on magnitudes of a plurality of phase currents flowing through a permanent magnet synchronous motor that rotates a load;
   a deterioration diagnoser that diagnoses, based on the negative-sequence current, deterioration of a plain bearing supporting a main shaft coupled to the permanent magnet synchronous motor; and
   a phase generator that detects a frequency of the plurality of phase currents and generates, using the frequency, a counter-rotating voltage phase, which rotates in a direction oppose a phase rotation direction of the plurality of phase alternating currents, wherein the negative-sequence current calculator calculates the negative-sequence current, based on the counter-rotating voltage phase and the plurality of phase currents.

2. The permanent magnet synchronous motor diagnostic device according to claim 1,
wherein the deterioration diagnoser detects enlargement of a hollow between the plain bearing and the main shaft, based on the negative-sequence current.

3. The permanent magnet synchronous motor diagnostic device according to claim 2,
wherein the deterioration diagnoser estimates an amount of wear of the plain bearing, based on the negative-sequence current.

4. The permanent magnet synchronous motor diagnostic device according to claim 2,
wherein the deterioration diagnoser estimates an amount of eccentricity of the permanent magnet synchronous motor, based on the negative-sequence current.

5. The permanent magnet synchronous motor diagnostic device according to claim 1,
wherein the plurality of phase currents are three-phase currents, and
wherein the negative-sequence current calculator includes:
a phase transformer that transforms the magnitudes of the three-phase currents into magnitudes of two-phase currents;
a rotational coordinates transformer that transforms the magnitudes of the two-phase currents into a first-axis direct current component and a second-axis direct current component, which are orthogonal to each other;
a first low-pass filter that receives the first-axis direct current component;
a second low-pass filter that receives the second-axis direct current component; and
an operator that calculates a square root of a sum of a square of an output of the first low-pass filter and a square of an output of the second low-pass filter, as the negative-sequence current.

6. The permanent magnet synchronous motor diagnostic device according to claim 5, comprising
three current detectors each current detector of which detects a magnitude of a corresponding phase current among the three-phase currents.

7. The permanent magnet synchronous motor diagnostic device according to claim 1,
wherein a ground fault interrupter is disposed between a system power supply and an inverter that drives the permanent magnet synchronous motor,
wherein the ground fault interrupter disconnects the system power supply and the inverter from each other when a zero-phase current having a predetermined value or greater flows between the system power supply and the inverter,
wherein the plurality of phase currents are three-phase currents, the permanent magnet synchronous motor diagnostic device, comprising:
a first current detector that detects a magnitude of a first phase current among the three-phase currents; and
a second current detector that detects a magnitude of a second phase current among the three-phase currents, and
wherein the negative-sequence current calculator includes:
a first phase transformer that calculates a sum of the magnitude of the first phase current and the magnitude of the second phase current, calculates a magnitude of a third phase current, among the three-phase currents, by reversing a sign of a value of the sum, and outputs the magnitudes of the three-phase currents consisting of the first phase current, the second phase current, and the third phase current;
a second phase transformer that transforms the magnitudes of the three-phase currents into magnitudes of two-phase currents;
a rotational coordinates transformer that transforms the magnitudes of the two-phase currents into a first-axis direct current component and a second-axis direct current component, which are orthogonal to each other;
a first low-pass filter that receives the first-axis direct current component;
a second low-pass filter that receives the second-axis direct current component; and
an operator that calculates a square root of a sum of a square of an output of the first low-pass filter and a square of an output of the second low-pass filter, as the negative-sequence current.

8. An inverter, comprising:
the permanent magnet synchronous motor diagnostic device according to claim 1, and
a voltage command generator that generates, based on a voltage phase, a plurality of phase voltage command values for driving the permanent magnet synchronous motor,
wherein the permanent magnet synchronous motor diagnostic device further includes a phase generator that generates a counter-rotating voltage phase which rotates in a direction oppose a phase rotation direction of the plurality of phase alternating currents by reversing a sign of the voltage phase, and
wherein the negative-sequence current calculator calculates the negative-sequence current, based on a magnitude of the counter-rotating voltage phase and magnitudes of the plurality of phase currents.

* * * * *